United States Patent [19]
Egawa

[11] Patent Number: 5,821,604
[45] Date of Patent: Oct. 13, 1998

[54] INTEGRATED CIRCUIT DEVICE HAVING SHIELD STRUCTURE AGAINST ELECTROMAGNETIC WAVE

[75] Inventor: Hidenori Egawa, Tokyo, Japan

[73] Assignee: NEC Corporation, Tokyo, Japan

[21] Appl. No.: 613,136

[22] Filed: Mar. 8, 1996

[30] Foreign Application Priority Data

Mar. 9, 1995 [JP] Japan ................................. 7-049642

[51] Int. Cl.⁶ ............................................... H01L 23/552
[52] U.S. Cl. ........................... 257/659; 257/701; 257/778
[58] Field of Search ................................. 257/659, 660, 257/778, 701, 737, 699

[56] References Cited

U.S. PATENT DOCUMENTS 5,051,815  9/1991  Hidaka ..................................... 257/659
5,578,874  11/1996  Kurogi et al. .......................... 257/778

*Primary Examiner*—Tom Thomas
*Assistant Examiner*—Roy Potter

[57] ABSTRACT

A hybrid integrated circuit device is equipped with a shield structure, and the shield structure has a peripheral shield frame soldered to a peripheral shield member of a mother board so as to encircle electrodes of the hybrid integrated circuit device therewith, thereby decreasing noise due to the electromagnetic wave generated by the electrodes.

9 Claims, 6 Drawing Sheets

INTEGRATED CIRCUIT DEVICE HAVING SHIELD STRUCTURE AGAINST ELECTROMAGNETIC WAVE

FIELD OF THE INVENTION

This invention relates to an integrated circuit device and, more particularly, to an integrated circuit device having a shield structure against electromagnetic radiation.

DESCRIPTION OF THE RELATED ART

FIGS. 1 and 2 illustrate a typical example of a hybrid integrated circuit device. The prior art hybrid integrated circuit device includes circuit components such as a semiconductor chip 1 and an insulating package 2. A recess 2a is formed in the insulating package 2, and a conductive strips 2b are printed on the inner surface of the insulating package 2.

An integrated circuit is fabricated on the semiconductor chip 1, and is connected through wires 1a to the conductive strips 2b. The other circuit components are similarly connected to the conductive strips 2b, and forms the hybrid integrated circuit together with the semiconductor chip 1.

The prior art hybrid integrated circuit device further includes an insulating cap layer 3 filling in the recess 2a, and the insulating package 2 and the insulating cap layer 3 hermetically seals the semiconductor chip 1 and the other circuit components therebetween.

The prior art hybrid integrated circuit device further includes solder ball array 4 provided on the lower surface of the insulating package 2. A large number of solder balls 4a forms the solder ball array 4, and are selectively connected through interconnections 4b (see FIG. 3) to the conductive strips 2b.

The prior art hybrid integrated circuit device further includes a shield structure 5 against electromagnetic radiation. A side-to-bottom shield wall 5a and a top shield plate 5b form in combination the shield structure 5.

A conductive substance is selectively plated on the side surface and the bottom surface of the insulating package 2; however, the solder balls 4a are spaced from the side-to-bottom shied wall 5a so as to maintain the electrical isolation. 4

On the other hand, a conductive paste is printed on the upper surface of the insulating cap 3 and the upper surface of the insulating package 2, and the conductive paste forms the top shield plate 5b. Alternatively, a metal plate is bonded to the upper surfaces, and serves as the top shield plate 5b. The side-to-bottom shield wall 5a and the top shield plate 5b are selectively covered with a protective resist film 6a (see FIG. 3).

The prior art hybrid integrated circuit device is mounted on a mother board 7 as shown in FIG. 3. Conductive strips 7a are formed on the upper surface of an insulating board 7b, and the conductive strips 7a are selectively covered with a protective resist film 7b.

The prior art hybrid integrated circuit device is mounted on the bother board 7 in such a manner align the solder balls 4a with the conductive strips 7a. Heat is applied to the solder balls 4a, and reflows the solder balls 4a. Then, the interconnections 4b are soldered to the conductive strips 7a, and the solder pieces 4c fix the prior art hybrid integrated circuit device to the mother board 7.

The solder layers 4c space the prior art hybrid integrated circuit device form the mother board 7, and gap 8 ranges from 0.1 millimeter to 0.5 millimeter.

Although the side-to-bottom shield wall 5a and the top shield plate 5b absorbs electromagnetic wave radiated from the prior art hybrid integrated circuit device 1 and the conductive strips 2b and 4b, the solder layers 4c radiate electromagnetic wave, and the gap 8 allows the electromagnetic wave to escape from the space between the prior art hybrid integrated circuit device and the mother board 7 to the outside. Only a conversion to heat and an absorption into a conductive member extinguish the electromagnetic wave. Otherwise, the electromagnetic wave repeats reflection on a boundary between substances different in dielectric constant, and affects other circuit components. The shield structure 5 only decreases the noise at −5 dB to −10 dB, and the noise is too much for a high integration density integrated circuit of the next generation.

In order to further decreases the noise, the prior art hybrid integrated circuit device is housed in a metal packaging case, or is embedded into a mother board.

The metal case does not allow the electromagnetic wave to escape from the inner space, and the other circuit components are prevented from the electromagnetic wave. However, the metal packaging case increases the weight of an electronic system, and occupies additional space. Moreover, the metal packaging case makes the packaging work complicated.

On the other hand, a conductive metal layer covers the surface over the prior art hybrid integrated circuit device embedded in the mother board, and other circuit components are prevented from the electromagnetic wave radiated from the prior art hybrid integrated circuit device. However, if a trouble takes place at least one of the circuit components, the defective circuit component is hardly replaced with a new circuit component, and the mother board per se becomes defective. This is uneconomical.

SUMMARY OF THE INVENTION

It is therefore an important object of the present invention to provide an integrated circuit which is effective against electromagnetic radiation and free from the problems of the metal packaging cap and the embedment in a mother board.

To accomplish the object, the present invention proposes to encircle electrodes within a frame-like conductive shield member.

In accordance with one aspect of the present invention, there is provided an integrated circuit device mounted on a board having an insulating layer and a plurality of conductive lands formed on a surface of the insulating layer, comprising: at least one circuit component; a package including an insulating member for accommodating the at least one circuit component, and a plurality of first electrodes formed on a central area of one surface of the insulating member and electrically connected to the at least one component, the plurality of first electrodes being fixed to the conductive lands when the integrated circuit device is mounted on the board; and a shield structure including a conductive wall covering another surface of the insulating member, a conductive frame formed on an outer peripheral area of the one surface so as to encircle the plurality of first electrodes therewith, and a frame formed on the surface of the insulating layer so as to encircle the conductive land.

In accordance with another aspect of the present invention, there is provided a hybrid integrated circuit comprising a substrate, convex electrodes formed on at least one surface of the substrate, and at least one frame-like convex electrode so as to encircle the first convex electrodes therein.

BRIEF DESCRIPTION OF THE DRAWINGS

The features and advantages of the integrated circuit device according to the present invention will be more clearly understood from the following description taken in conjunction with the accompanying drawings in which.

DESCRIPTION OF THE PREFERRED EMBODIMENTS

First Embodiment

Figure 1:
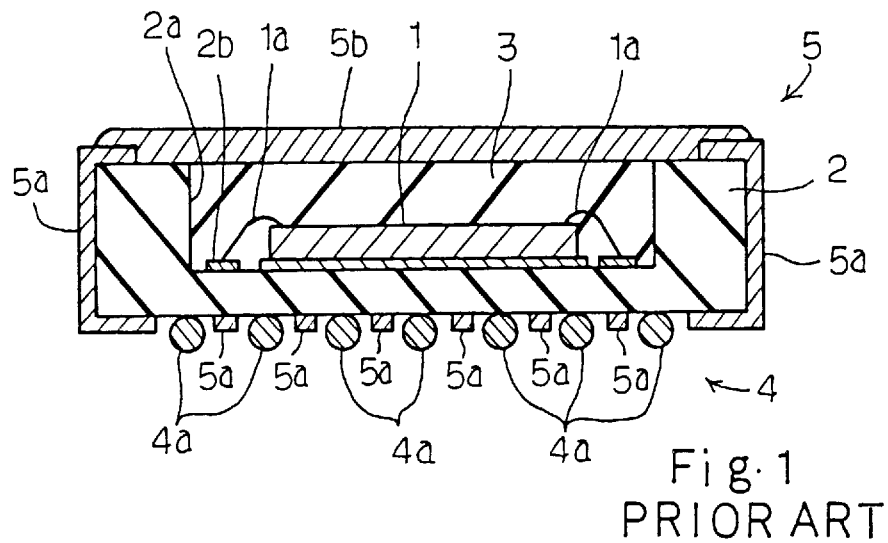
FIG. 1 is a cross sectional view showing the structure of the prior art hybrid integrated circuit device.
Figure 2:
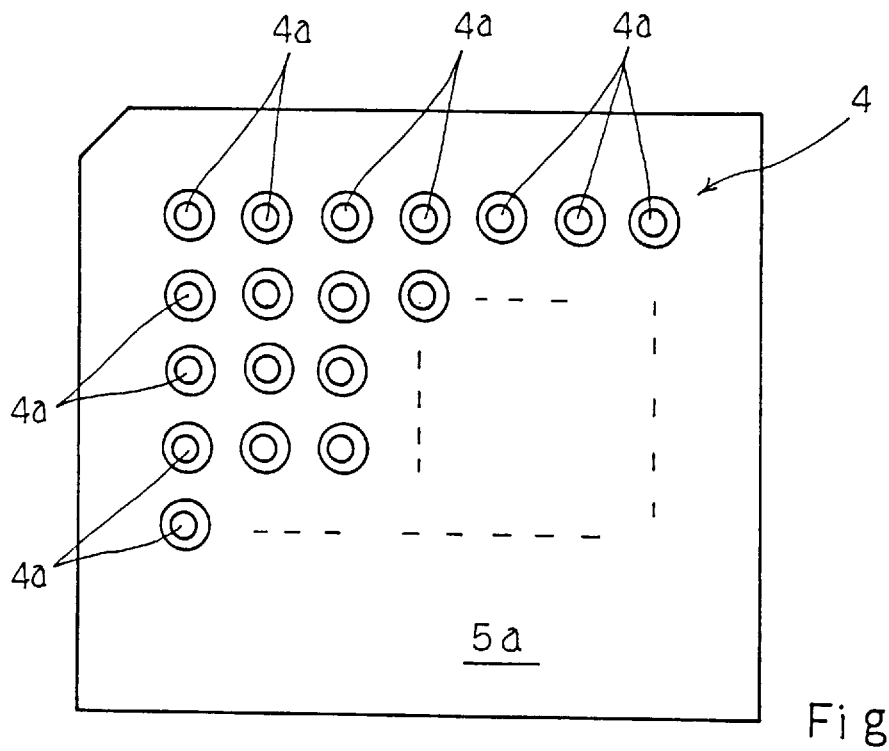
FIG. 2 is a bottom view showing the solder ball array on the lower surface of the prior art hybrid integrated circuit device.
Figure 3:
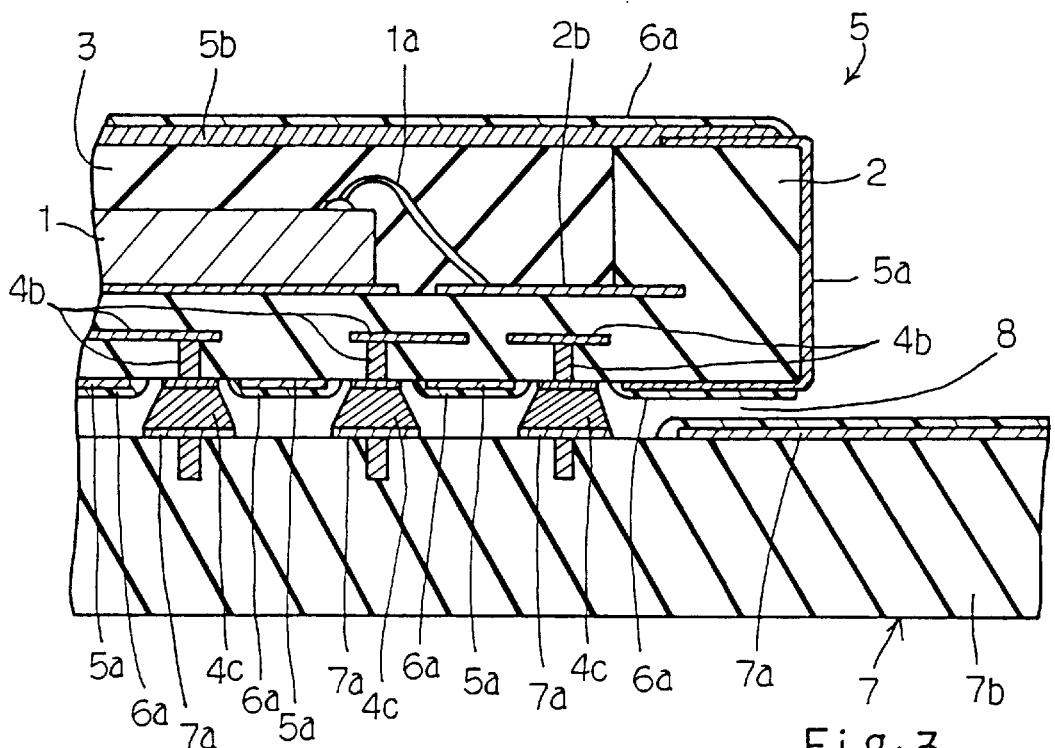
FIG. 3 is a cross sectional view showing the prior art hybrid integrated circuit device mounted on the mother board.
Figure 4:
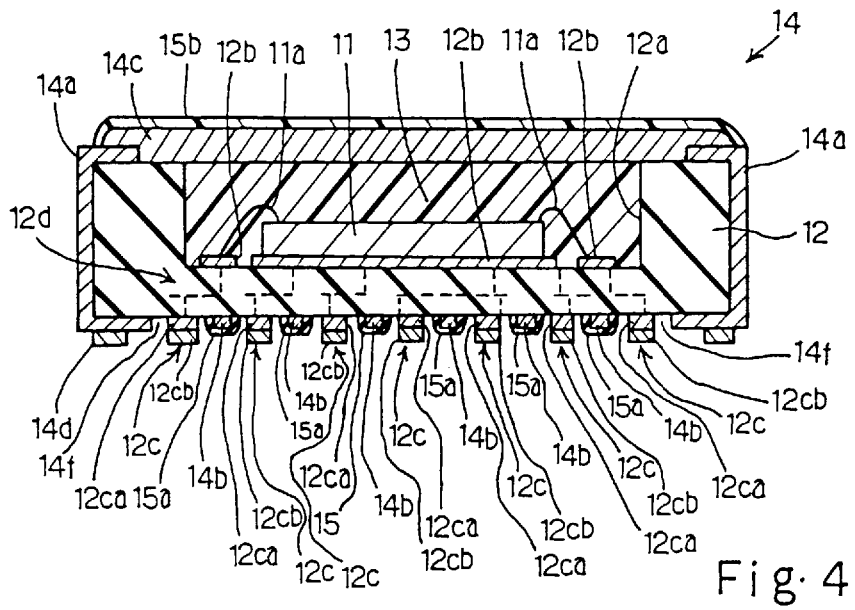
FIG. 4 is a cross sectional view showing the structure of a hybrid integrated circuit device according to the present invention.
Figure 5:
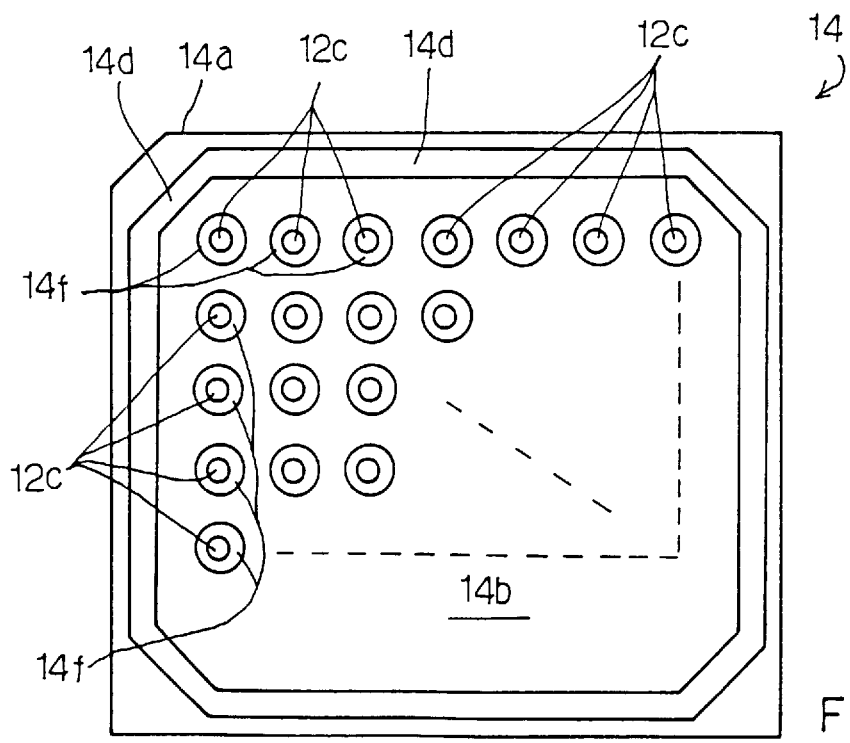
FIG. 5 is a bottom view showing the solder ball array surrounded by a frame-like protective electrode on the lower surface of the hybrid integrated circuit device.

Referring to FIGS. 4 and 5 of the drawings, a hybrid integrated circuit device embodying the present invention comprises circuit components such as a semiconductor chip 11 and an insulating package 12. A recess 12a is formed in the insulating package 12, and a conductive strips 12b are printed on the inner surface of the insulating package 12.

An integrated circuit is fabricated on the semiconductor chip 11, and is connected through gold wires 11a to the conductive strips 12b. The other circuit components (not shown) are similarly connected to the conductive strips 12b, and forms the hybrid integrated circuit together with the semiconductor chip 11.

The hybrid integrated circuit device further comprises conductive electrodes 12c formed on the lower surface of the insulating package 12 and interconnections/through-holes 12d electrically connecting the conductive strips 12b to the conductive electrodes 12c. The integrated circuit and the other circuit components communicate through the conductive electrodes 12c with the outside thereof.

The hybrid integrated circuit device further comprises an insulating cap layer 13 filling in the recess 12a, and the insulating cap layer 13 is formed of epoxy resin. The insulating package 12 and the insulating cap layer 13 hermetically seals the semiconductor chip 11 and the other circuit components therebetween.

The hybrid integrated circuit device further comprises a shield structure 14 against electromagnetic radiation. The shield structure 14 includes a side shield wall 14a, a bottom shield layer 14b, a top shield plate 14c, a peripheral shield frame 14d and a peripheral shield member 14e (see FIGS. 6 and 7). The peripheral shield member 14e will be described hereinlater with reference to FIGS. 6 and 7.

The side shield wall 14 is formed of conductive substance, and covers the side surface of the insulating package 12. The side shield wall 14 inwardly projects from the outer periphery of the upper surface of the insulating package 12 and the outer periphery of the lower surface of the insulating package 12, and further covers the outer peripheral area of the upper surface and the outer peripheral area of the lower surface.

The bottom shield layer 14b is also formed of the conductive substance, and is merged with the side shield wall 14. Holes 14f are formed in the bottom shield layer 14b so as to space the conductive electrodes 12c from the bottom shield layer 14b. The bottom shield layer 14b is selectively covered with a protective resist layer 15a.

The top shield plate 14c is formed of conductive substance, and extends over the upper surface of the insulating cap layer 13 and the inner peripheral area of the upper layer of the insulating package 12. The top shield plate 14c is held in contact with the side shield wall 14a, and is covered with a protective resist layer 15b.

The peripheral shield frame 14d is formed of the conductive substance, and extends on the side shield wall 14a on the outer peripheral area of the lower surface of the insulating package 12. The conductive electrodes 12c are encircled with the peripheral shield frame 14d. The height of the peripheral shield frame 14d measured from the lower surface is approximately equal to the height of the conductive electrodes 12c measured from the lower surface, and, accordingly, the lower surface of the peripheral shield frame 14d is substantially coplanar with the lower surfaces of the conductive electrodes 12c.

Figure 6:
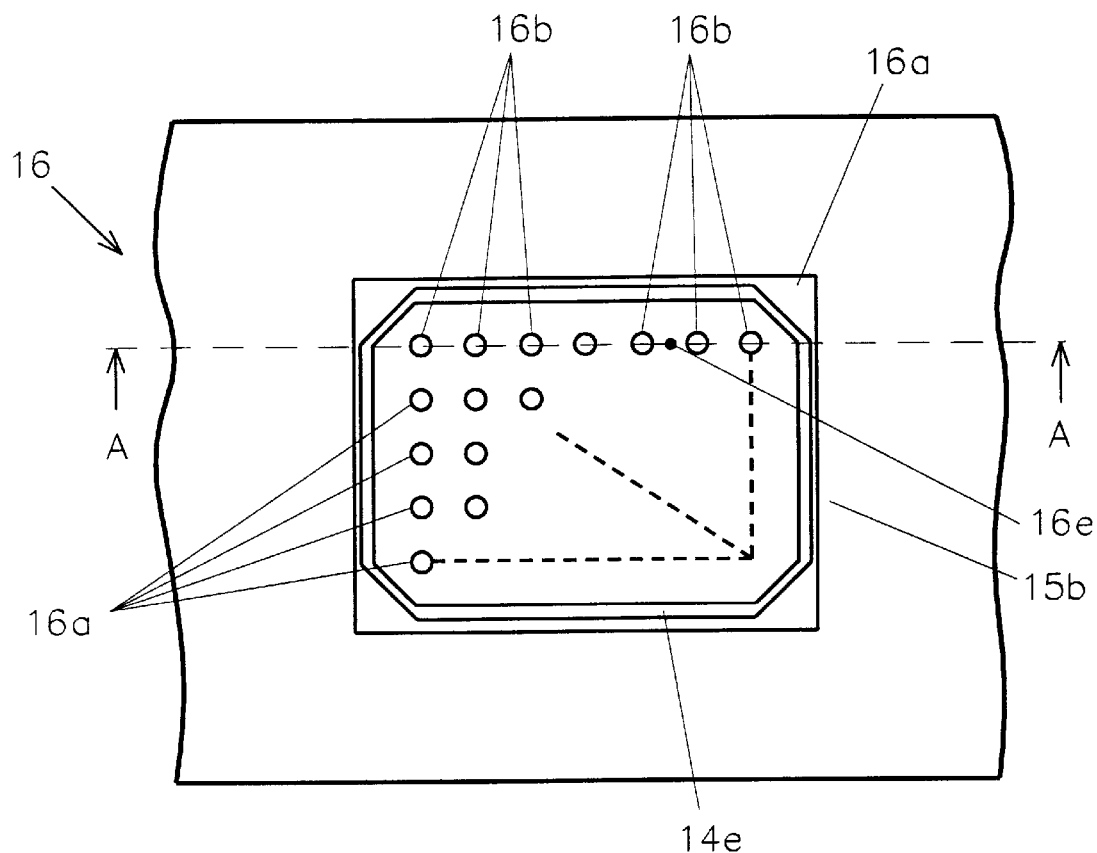
FIG. 6 is a plan view showing a land pattern formed on a part of a mother board.
Figure 7:
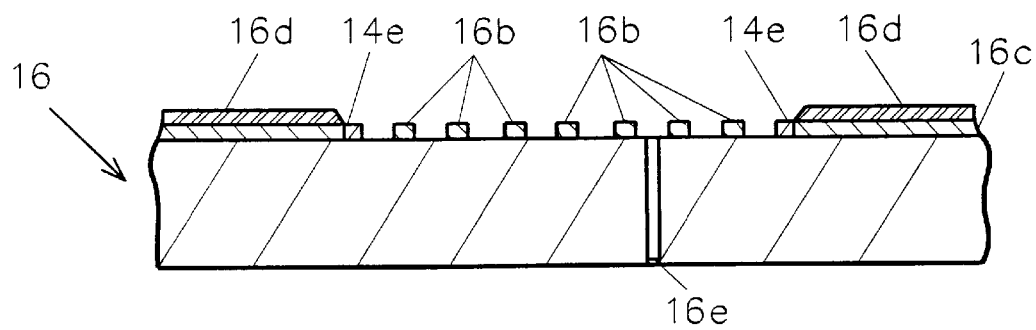
FIG. 7 is a cross sectional view taken along line A—A of FIG. 6 and showing the land pattern.

Turning to FIGS. 6 and 7, a mother board 16 has an area 16a assigned to the hybrid integrated circuit device shown in FIGS. 4 and 5. A plurality of conductive lands 16b are formed in a central sub-area of the area 16a, and are corresponding to the conductive electrodes 12c.

The peripheral shield member 14e is formed in a peripheral sub-area of the area 16a, and the conductive lands 16b are encircled with the peripheral shield member 14e. There is no substantial difference in height between the conductive lands 16b and the peripheral shield member 14e. The peripheral shield member 14e is connected to a shield pattern 16c of the mother board 16 without a gap, and a protective resist layer 16d covers the shield pattern 16c. A through-hole 16e is formed in the mother board 16 so as to evacuate gas generated in a soldering stage to the outside.

The hybrid integrated circuit device shown in FIGS. 4 and 5 are fabricated as follows. First, the insulating package 12 is prepared. While the through-holes 12d are formed, the side shield wall 14a and the bottom shield layer 14b are concurrently grown to 20 to 20 microns thick by using an electroless plating. Conductive pads 12ca are patterned, and a photo-resist mask (not shown) is formed. The photo-resist mask exposes the conductive pads 12ca and a peripheral area of the side shield wall 14a on the lower surface. Subsequently, the peripheral shield frame 14d and conductive layers 12b are concurrently grown on the peripheral area of the side shield wall 14a and the conductive pads 12ca by using an electroplating. The conductive pads 12ca and the conductive layers 12cb form the conductive electrodes 12c. Thus, the peripheral shield frame 14d is approximately equal in height to the conductive electrodes 12c.

The total thickness of the shield pattern 16c and the protective resist layer 16d ranges between 30 microns and 60 microns. If the peripheral shield frame 14d and the conductive layers 12cb are too thin, a gap is undesirably formed. The peripheral shield frame 14d and the conductive layers 12cb are preferably greater than 0.1 millimeter thick for a standard hybrid integrated circuit device. However, if the peripheral shield frame 14d and the conductive layers 12cb are too thick, the hybrid integrated circuit device is unstably mounted on the mother board 16. For this reason, the peripheral shield frame 14d and the conductive layers 12cb are not thicker than 1 millimeter. The peripheral shield frame 14d is preferably as narrow as the conductive electrodes 12c.

Subsequently, a router (not shown) forms the recess 12a, and the conductive strips 12b are exposed to the recess 12a. The semiconductor chip 11 and the other circuit components are mounted on the conductive strips 12b, and the gold wires 1a bonds the semiconductor chip 11 to the conductive strips 12b. The recess 12a is filled with the epoxy resin, and the epoxy resin is cured. As a result, the semiconductor chip 11 and the other circuit components are sealed between the insulating package 12 and the insulating layer 13. The recess 12a may not be filled.

Subsequently, conductive paste is printed in such a manner as to be partially overlapped with the side shield wall 14a on the upper surface, and the printed conductive paste is 20 microns in thickness. The conductive paste layer is cured at 150 degrees in centigrade for 30 minutes, and is converted to the top shield plate 14c.

Finally, resist solution is coated to 20 micron thick on the top shield plate 14c, and is cured at 150 degrees in centigrade for 10 minutes. Then, the top shield plate 14c is covered with the protective resist layer 15b.

Figure 8:
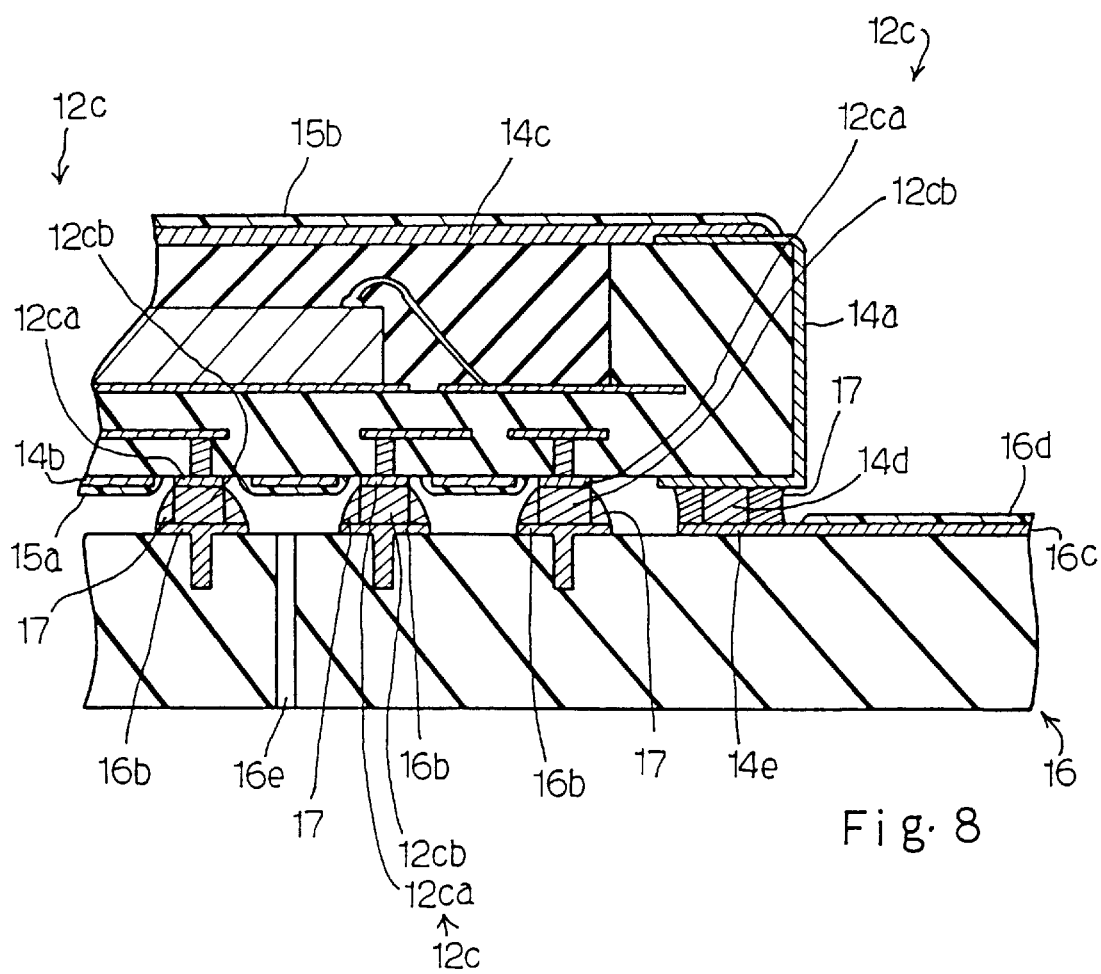
FIG. 8 is a cross sectional view showing the hybrid integrated circuit device mounted on the mother board.

The hybrid integrated circuit device is mounted on the mother board as follows. First, solder paste is screen printed on the conductive lands 16b and the peripheral shield member 14e, and the hybrid integrated circuit device is placed in the area 16a in such a manner that the conductive electrodes 12c and the peripheral shield frame 14d are aligned with the conductive lands 16b and the peripheral shield member 14e. The solder paste is reflowed, and solder 17 fixes the conductive electrodes 12c to the conductive lands 16b as shown in FIG. 8. Thus, the hybrid integrated circuit device is mounted on the mother board 16. The gas is evacuated through the through-hole 16e during the soldering stage.

As will be appreciated from the foregoing description, the conductive lands 16b and the conductive electrodes 12c are encircled with the peripheral shield frame 14d and the peripheral shield member 14e, and electromagnetic wave is confined in the inner space inside of the peripheral shield frame 14d and the peripheral shield member 14e. As a result, the noise due to the electromagnetic radiation is drastically decreased.

The shield structure 14 is simpler than the prior art metal packaging case, and does not increase the weight and complexity of the fabrication process. Moreover, even if the hybrid integrated circuit device or another circuit component is damaged, the defective component is replaceable, and, accordingly, is economical.

Second Embodiment

Figure 9:
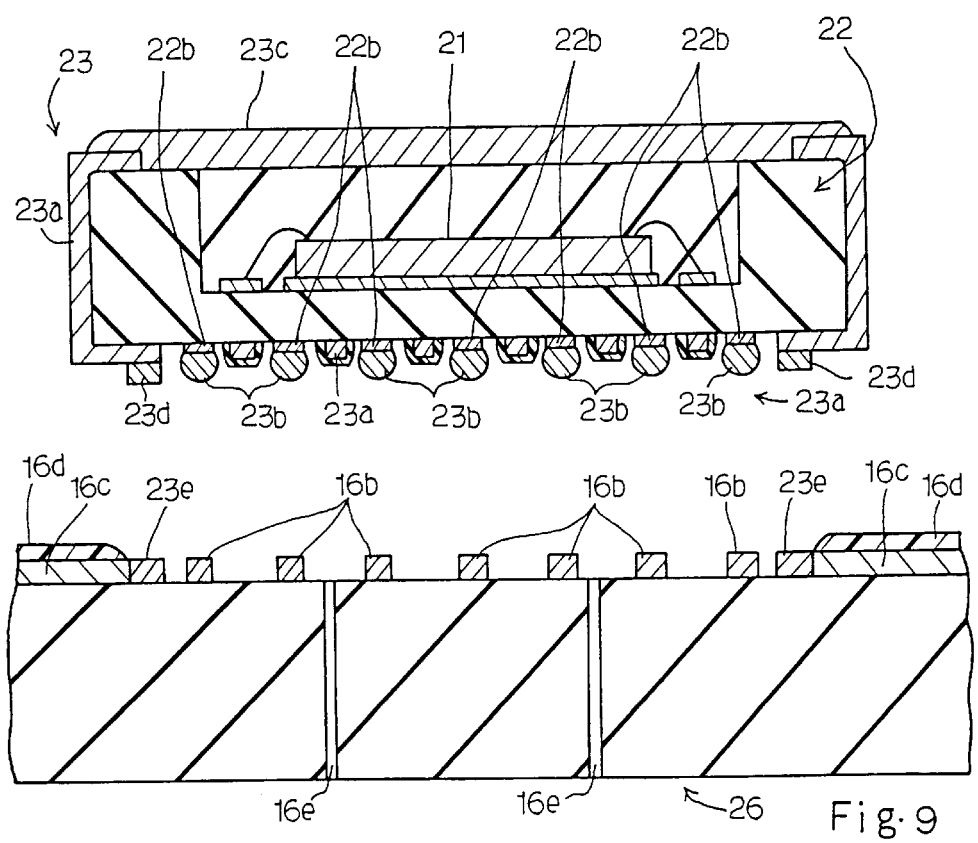
FIG. 9 is a cross sectional view showing the structure of a semiconductor integrated circuit device according to the present invention.

Turning to FIG. 9 of the drawings, a semiconductor integrated circuit device embodying the present invention largely comprises a semiconductor chip 21, a ball-grid array type insulating package 22 and a shield structure 23. The ball-grid array type insulating package 22 is analogous to the insulating package 12 and the insulating layer 13 except for a solder ball array 23a. The solder balls 23b are provided on the lower surface of the package 22 instead of the conductive electrodes 12c.

The semiconductor integrated circuit device is mounted on a mother board 26. The mother board 26 is similar to the mother board 16, and, parts and layers of the mother 26 are labeled with the parts and the layers of the mother board 16.

The shield structure 23 is similar to the shield structure 14, and includes a side shield wall 23a, a bottom shield layer 23b, a top shield plate 23c, a peripheral shield frame 23d and a peripheral shield member 23e.

The solder paste is printed on the peripheral shield frame 23d. The solder balls 23b are aligned with the conductive lands 16b, and are reflowed so as to mount the semiconductor integrated circuit device on the mother board 26. The electrodes 22b soldered to the conductive lands 16b are confined in the inner space defined by the peripheral shield frame 23d and the peripheral shield member 23e, and the shield structure 23 drastically decreases the noise due to the electromagnetic wave.

Although particular embodiments of the present invention have been shown and described, it will be obvious to those skilled in the art that various changes and modifications may be made without departing from the spirit and scope of the present invention.

First, the peripheral shield frame 14d may be discontinued or partially decreased in width. While the solder paste is being reflowed, the solder is maintained at the discontinuity, and closes the discontinuity. The discontinued peripheral shield frame restricts the movement of the reflowed solder, and enhances uniformity of the solder.

The peripheral shield frame may selectively surround electrodes radiating noise. In this instance, some electrodes such as, for example, test electrodes are provided outside the peripheral shield frame.

The conductive electrodes 12c may be divided into groups respectively encircled with a plurality of peripheral shield frame/member pairs.

What is claimed is:

1. An integrated circuit device mounted on a board having an insulating layer and a plurality of conductive lands formed on a surface of said insulating layer, comprising:
    at least one circuit component;
    a package including
        an insulating member for accommodating said at least one circuit component, and
        a plurality of first electrodes formed on a central area of one surface of said insulating member and electrically connected to said at least one component, said plurality of first electrodes being fixed to said conductive lands when said integrated circuit device is mounted on said board; and
    a shield structure including
        a conductive wall covering another surface of said insulating member,
        a conductive frame formed over an outer peripheral area of said one surface so as to encircle said plurality of first electrodes therewith, and
        a frame formed on said surface of said insulating layer so as to encircle said conductive lands.

2. The integrated circuit device as set forth in claim 1, in which said at least one circuit component forms a part of a hybrid integrated circuit.

3. The integrated circuit device as set forth in claim 1, in which said plurality of first electrodes have a first height measured from said one surface and approximately equal to a second height of said conductive frame measured from said one surface.

4. The integrated circuit device as set forth in claim 3, in which said first height of said plurality of first electrodes ranges from 0.1 millimeter to 1 millimeter.

5. The integrated circuit device as set forth in claim 1, in which said package further includes at least one second electrode formed on a certain area of said one surface outside of said conductive frame.

6. The integrated circuit device as set forth in claim 1, in which said conductive frame is held in contact with said conductive wall.

7. The integrated circuit device as set forth in claim 1, in which said conductive wall has a side sub-wall covering a side wall of said insulating member, a bottom sub-wall covering a lower surface of said insulating member so as to be merged with said side sub-wall and spaced from said plurality of first electrodes, and a top sub-wall covering an upper surface of said insulating member and held in contact with said side sub-wall.

8. The integrated circuit device as set forth in claim 7, in which said conductive frame is formed on conductive wall over said one surface.

9. The integrated circuit device as set forth in claim 1, in which said conductive frame is partially discontinued so as to form an opening, and said opening is closed by a solder piece during a mounting stage when said integrated circuit device is soldered to said board.

* * * * *